United States Patent
Kim et al.

(10) Patent No.: US 8,357,949 B2
(45) Date of Patent: Jan. 22, 2013

(54) LIGHT-EMITTING DEVICE, LIGHT-EMITTING DEVICE PACKAGE AND LIGHTING SYSTEM

(75) Inventors: Sungkyoon Kim, Seoul (KR); Woosik Lim, Seoul (KR); Sungho Choo, Seoul (KR); Heeyoung Beom, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 7 days.

(21) Appl. No.: 13/071,195

(22) Filed: Mar. 24, 2011

(65) Prior Publication Data
US 2011/0233589 A1 Sep. 29, 2011

(30) Foreign Application Priority Data
Mar. 25, 2010 (KR) .................. 10-2010-0026930

(51) Int. Cl.
*H01L 33/60* (2010.01)
(52) U.S. Cl. .................. 257/98; 257/E33.067
(58) Field of Classification Search .............. 257/98, 257/E33.068, E33.067; 313/421, 423; 438/29
See application file for complete search history.

(56) References Cited

U.S. PATENT DOCUMENTS

| 6,369,506 | B1 * | 4/2002 | Hata | 313/499 |
| 2002/0024055 | A1 * | 2/2002 | Uemura et al. | 257/98 |
| 2010/0171094 | A1 * | 7/2010 | Lu et al. | 257/13 |
| 2010/0301363 | A1 * | 12/2010 | Iwata et al. | 257/98 |

* cited by examiner

*Primary Examiner* — William D Coleman
*Assistant Examiner* — Christine Enad
(74) *Attorney, Agent, or Firm* — Birch, Stewart, Kolasch & Birch, LLP

(57) ABSTRACT

A light-emitting device includes a substrate, a light-emitting structure on the substrate, the light-emitting structure including a first semiconductor layer, an active layer and a second semiconductor layer, a light-transmitting electrode layer on the second semiconductor layer, and a first reflective layer on the light-transmitting electrode layer, wherein the first reflective layer includes a first layer having a first index of refraction and a second layer having a second index of refraction different from the first index of refraction. Based on this configuration, it is possible to protect the light-emitting device and improve luminous efficiency thereof.

19 Claims, 15 Drawing Sheets ary of the Invention## LIGHT-EMITTING DEVICE, LIGHT-EMITTING DEVICE PACKAGE AND LIGHTING SYSTEM

CROSS-REFERENCE TO RELATED APPLICATION

This application claims the priority benefit of Korean Patent Application No. 10-2010-0026930, filed on Mar. 25, 2010 in the Korean Intellectual Property Office, the disclosure of which is incorporated herein by reference.

BACKGROUND OF THE INVENTION

1. Field of the Invention

The present embodiment relates to a light-emitting device, a light-emitting device package and a lighting system.

2. Description of the Related Art

A light-emitting diode (LED) is a device which converts electric signals into infrared rays, visible rays or light using characteristics of compound semiconductors. LEDs are now being applied to devices such as home appliances, remote controls, electronic boards, displays, a variety of automatic appliances and the like and their application range gradually widens.

Generally, a miniaturized LED is fabricated in a surface mount device type such that it can be directly mounted to a printed circuit board (PCB). Accordingly, an LED lamp used as a display device is also developed in a surface mount device. Such a surface mount device may alternate conventional lamp and is used as lighting displays, character displays, image displays and the like.

As the application range of LEDs widens, brightness required for lights in daily use and lights for structural signals increases. Accordingly, it is important to increase luminous efficacy of LEDs.

SUMMARY OF THE INVENTION

Therefore, the present embodiment has been made in view of the above problems, and provides a light-emitting device, a light-emitting device package and a lighting system.

In accordance with one aspect of the present embodiment, the above and other embodiment can be accomplished by the provision of a light-emitting device including: a substrate; a light-emitting structure on the substrate, the light-emitting structure including a first semiconductor layer, an active layer and a second semiconductor layer on the substrate; a light-transmitting electrode layer on the second semiconductor layer; and a first reflective layer on the light-transmitting electrode layer, wherein the first reflective layer comprises a first layer having a first index of refraction and a second layer having a second index of refraction different from the first index of refraction.

Also, the first layer may have a lower index of refraction than the second layer.

Also, the first layer may have an index of refraction of 1.4 to 1.6.

Also, at least one of the first layer and the second layer may comprise at least one of $SiO_2$, $Al_2O_3$ and $TiO_2$.

Also, the first layer and the second layer may be repeatedly alternately laminated.

Also, the first layer and the second layer may have a thickness of 2 Å to 10 um.

Also, the device may further include: a first electrode pad on the partially exposed top of the first semiconductor layer; and a second electrode pad on the second semiconductor layer, wherein the first reflective layer is on the top of the light-transmitting electrode layer and the exposed top of the first semiconductor layer.

Also, the first reflective layer may extend from the top of the light-transmitting electrode layer to the top of the first semiconductor layer along the side of the active layer and the second semiconductor layer.

Also, the device may further include: a second reflective layer on the second semiconductor layer, such that the second reflective layer at least partially vertically overlaps the second electrode pad, wherein the second reflective layer includes a third layer having a third index of refraction and a fourth layer having a fourth index of refraction different from the third index of refraction.

Also, the device may further include: an opening provided in a region of the light-transmitting electrode layer, wherein the second electrode pad is on the opening and the second reflective layer contacts the second electrode pad and the second semiconductor layer.

Also, the third layer may have a lower index of refraction than that of the fourth layer.

Also, the third layer may have an index of refraction of 1.4 to 1.6.

Also, at least one of the third layer and the fourth layer may include at least one of $SiO_2$, $Al_2O_3$ and $TiO_2$.

Also, the third layer and the fourth layer may be repeatedly alternately laminated.

Also, the third layer and the fourth layer may have a thickness of 2 Å to 10 um.

Also, the width of the second reflective layer may be greater than that of the second electrode pad.

Also, the device may further include: a buffer layer on the substrate.

Also, the device may further include: a shock buffer layer on the outer surface of the first reflective layer.

BRIEF DESCRIPTION OF THE DRAWINGS

The above and other features and other advantages of the present embodiment relates to a light-emitting device, a light-emitting d will be more clearly understood from the following detailed description taken in conjunction with the accompanying drawings, in which.

DETAILED DESCRIPTION OF THE PREFERRED EMBODIMENTS

Figure 1A:
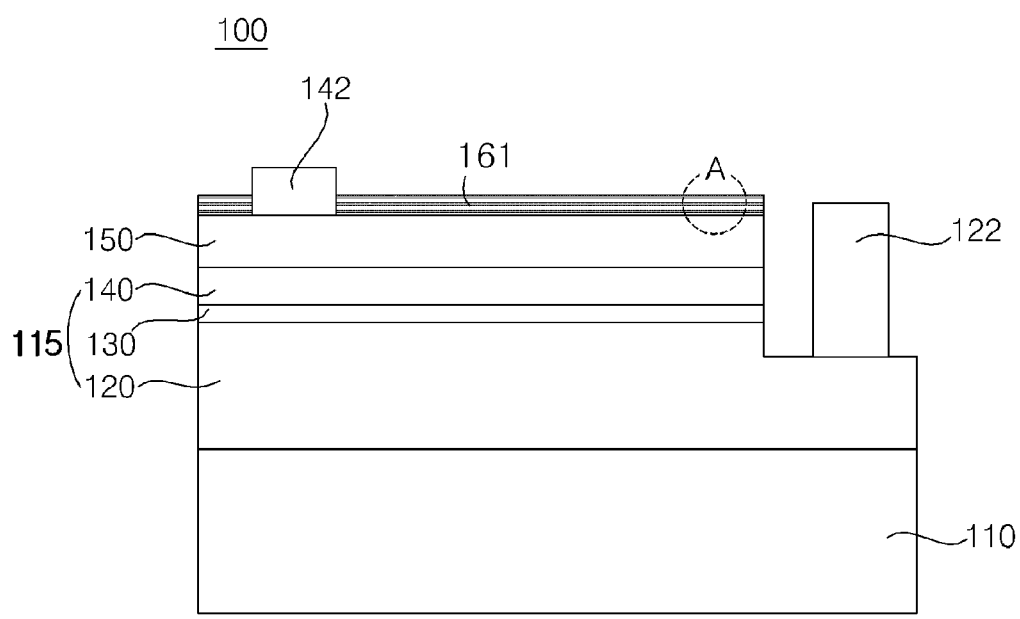
FIG. 1A is a sectional view illustrating the cross-section of a light-emitting device according to an embodiment.

Reference will now be made in detail to the embodiments of the present invention, examples of which are illustrated in the accompanying drawings. Wherever possible, the same reference numbers will be used throughout the drawings to refer to the same or like parts.

Prior to description of the embodiments, it will be understood that, when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

In the drawings, the thicknesses or sizes of respective layers are exaggerated, omitted or schematically illustrated for clarity and convenience of description. Therefore, the sizes of respective elements do not wholly reflect actual sizes thereof.

Hereinafter, the present embodiment relates to a light-emitting device, a light-emitting dwill be described in more detail with reference to the annexed drawings.

Figure 1B:
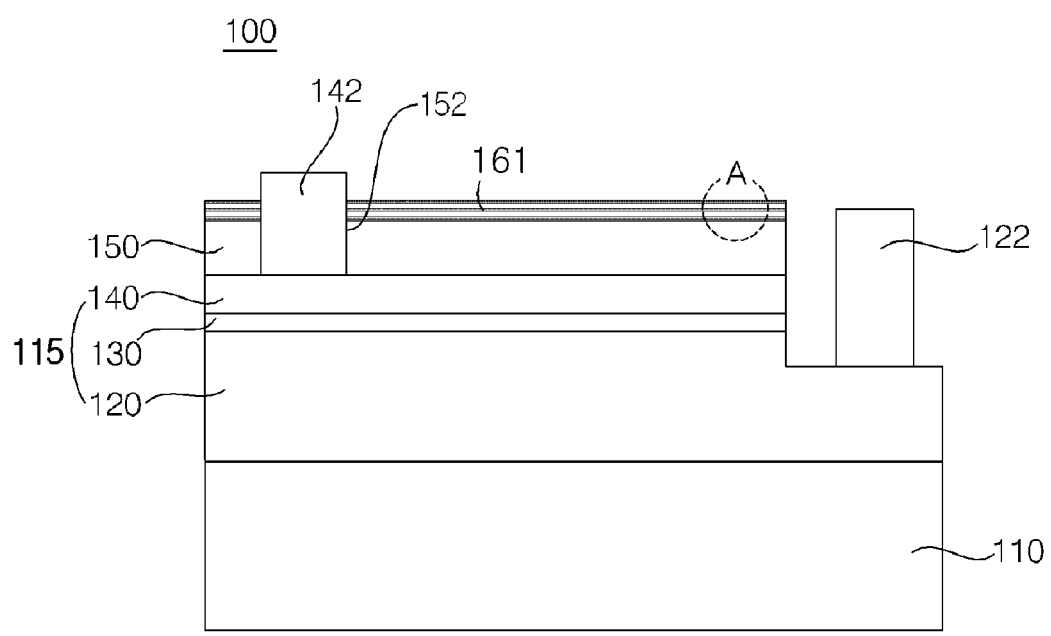
FIG. 1B is a sectional view illustrating the cross-section of a light-emitting device according to an embodiment.

FIG. 1A is a sectional view illustrating the cross-section of a light-emitting device according to one embodiment. FIG. 1B is a sectional view illustrating the cross-section of a light-emitting device according to one embodiment.

First, referring to FIG. 1A, a light-emitting device 100 includes a substrate 110, a light-emitting structure 115 on the substrate 110 and including a first semiconductor layer 120, an active layer 130 and a second semiconductor layer 140, a light-transmitting electrode layer 150 on the light-emitting structure 115 and a first reflective layer 161 on the light-transmitting electrode layer 150.

The substrate 110 may be composed of a light-transmitting material such as sapphire ($Al_2O_3$), GaN, SiC, ZnO, Si, GaP and GaAs. The substrate 110 may be replaced by a silicone material with superior heat-conductivity by a process such as flip chip bonding, after the light-emitting device 100 is fabricated.

Meanwhile, a patterned substrate (PSS) structure may be provided on the substrate 110 to improve light extraction efficiency. The substrate 110 mentioned herein may or may not have a PSS structure.

Meanwhile, although not shown, a buffer layer (not shown) may be on the substrate 110 to prevent lattice mismatch between the substrate 110 and the first semiconductor layer 120 and facilitate growth of the semiconductor layers.

The buffer layer (not shown) may have an AlInN/GaN laminate structure, an $In_xGa_{1-x}N$/GaN laminate structure or an $Al_xIn_yGa_{1-x-y}N$/$In_xGa_{1-x}N$/GaN laminate structure which includes AlN and GaN.

The light-emitting structure 115 is on the substrate 110 and the light-emitting structure 115 may include the first semiconductor layer 120, the active layer 130 and the second semiconductor layer 140.

The first semiconductor layer 120 may be on the substrate 110. The first semiconductor layer 120 may be an n-type semiconductor layer. For example, the n-type semiconductor layer may be selected from semiconductor materials such as GaN, AlN, AlGaN, InGaN, InN, InAlGaN and AlInN having the formula of $In_xAl_yGa_{1-x-y}N$ ($0 \leq x \leq 1$, $0 \leq y \leq 1$, $0 \leq x+y \leq 1$), and be doped with an n-type dopant such as Si, Ge, Sn, Se and Te.

The active layer 130 is on the first semiconductor layer 120. The active layer 130 may be formed with a single or multi-quantum well structure, a quantum wire structure, a quantum dot structure or the like using a compound semiconductor material composed of Group III-V elements.

In the case where the active layer 130 has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a band gap smaller than that of the barrier layer.

A conductive clad layer (not shown) may be on or/and under the active layer 130. The conductive clad layer (not shown) may be formed of an AlGaN-based semiconductor, and may have a greater band gap than the active layer 130.

The second semiconductor layer 140 may be on the active layer 130. The second semiconductor layer 140 may be realized with a p-type semiconductor layer doped with a p-type dopant. The p-type semiconductor layer may be selected from semiconductor materials such as GaN, AlN, AlGaN, InGaN, InN, InAlGaN and AlInN having the formula of $In_xAl_yGa_{1-x-y}N$ ($0 \leq x \leq 1$, $0 \leq y \leq 1$, $0 \leq x+y \leq 1$) and may be doped with a p-type dopant such as Mg, Zn, Ca, Sr and Ba.

The first semiconductor layer 120, the active layer 130 and the second semiconductor layer 140 may be formed by a method such as metal organic chemical vapor deposition (MOCVD), chemical vapor deposition (CVD), plasma-enhanced chemical vapor deposition (PECVD), molecular beam epitaxy (MBE) and hydride vapor phase epitaxy (HVPE), without being limited thereto.

In addition, the concentration of conductive dopant in the first semiconductor layer 120 and the second semiconductor layer 140 may be uniform or non-uniform. That is, the structure of a plurality of semiconductor layers may be varied and is not limited thereto.

Meanwhile, the light-emitting structure 115 may include a third semiconductor layer (not shown) with a polarity opposite that of the first semiconductor layer 120, arranged under the first semiconductor layer 120. In addition, the first semiconductor layer 120 may be realized with a p-type semiconductor layer and the second semiconductor layer 140 may be realized with an n-type semiconductor layer. Accordingly, the light-emitting structure layer 115 may include at least one of N—P junction, P—N junction, N—P—N junction and P—N—P junction structures, without being limited thereto.

The active layer 130 and the second semiconductor layer 140 are partially removed to expose a part of the first semiconductor layer 120 and a first electrode pad 122 may be on the exposed first semiconductor layer 120.

Meanwhile, the partial exposure of the first semiconductor layer 120 may be carried out by a predetermined etching method and is not limited thereto. Meanwhile, the etching method may be a wet or dry etching method.

In addition, a second electrode pad 142 and a light-transmitting electrode layer 150 may be on the second semiconductor layer 140.

As shown in FIG. 1A, the second electrode pad 142 may be formed on the light-transmitting electrode layer 150 or, as shown in FIG. 1B, the second electrode pad 142 may be formed by removing a part of the light-transmitting electrode layer 150 to form an opening 152, such that the second electrode pad 142 comes in contact with the second semiconductor layer 140, without being limited thereto.

Meanwhile, the first and second electrode pads 122 and 142 may include a conductive material, for example, a metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof and may have a mono- or multi-layer structure, without being limited thereto.

The light-transmitting electrode layer 150 may include at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO and is on the second semiconductor layer 140 to prevent current crowding.

Meanwhile, in one embodiment, the first reflective layer 161 may be on the light-transmitting electrode layer 150.

Figure 1C:
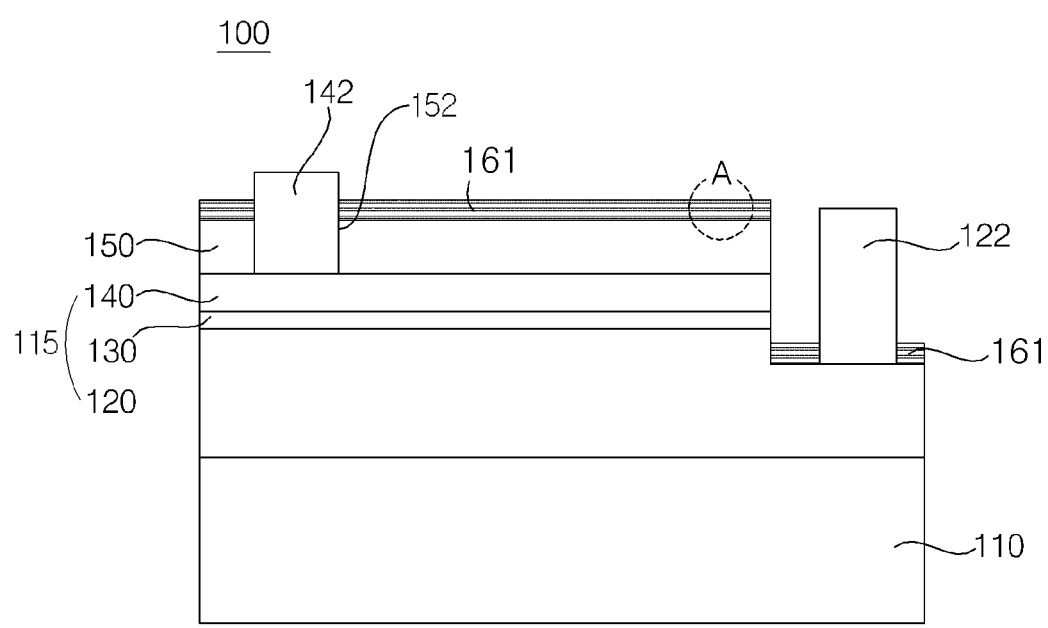
FIG. 1C is a sectional view illustrating the cross-section of a light-emitting device according to an embodiment.

The first reflective layer 161, as shown in FIGS. 1A and 1B, may be formed in the entire region of the light-transmitting electrode layer 150 except for the second electrode pad 142, or as shown in FIG. 1C, the first reflective layer 161 may be formed in a region provided on the first semiconductor layer 120 and the second semiconductor layer 140 except for a region in which the first and second electrode pads 122 and 142 are present, without being limited thereto.

Figure 1D:
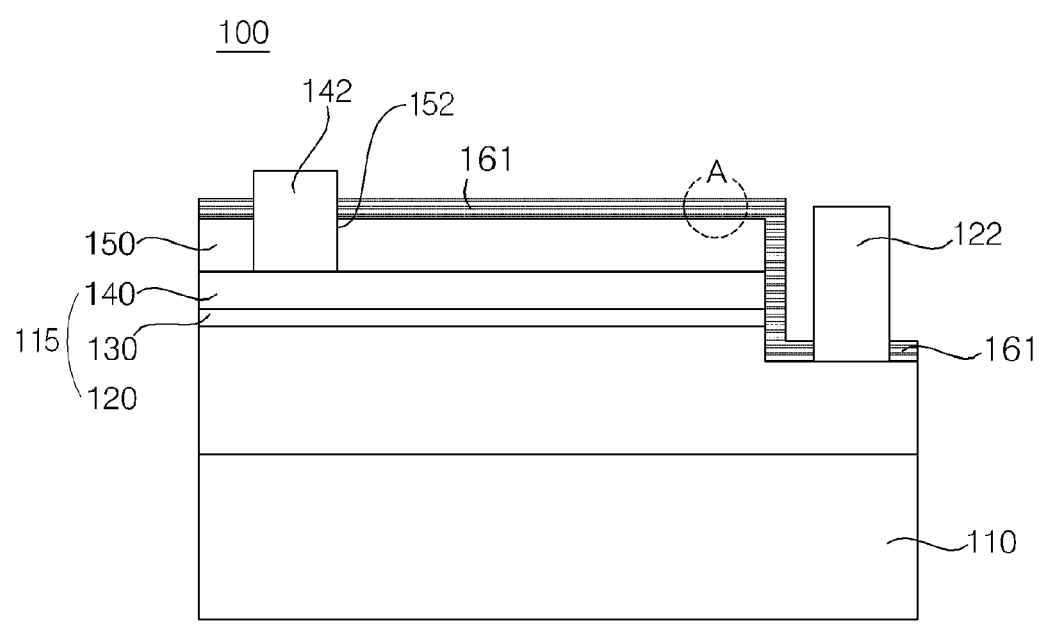
FIG. 1D is a sectional view illustrating the cross-section of a light-emitting device according to an embodiment.

In particular, referring to FIG. 1D, the first reflective layer 161 may extend from the top of the light-transmitting electrode layer 150 to the top of the first semiconductor layer 120 along the side of the active layer 130 and the second semiconductor layer 140 partially removed to expose a part of the first semiconductor layer 120.

As described below, the first reflective layer 161 exhibits high light reflectivity. For this reason, when the first reflective layer 161 is formed at the outer side of the light-emitting structure 115, in the case where the light-emitting device 100 of the embodiment is used as a flip chip, luminous efficiency can be improved.

In addition, the first reflective layer 161 serves to protect the light-transmitting electrode layer 150 or the first semiconductor layer 120 from external damage.

Meanwhile, a shock buffer layer (not shown) may be further formed on the outer surface of the first reflective layer 161. The shock buffer layer (not shown) formed on the outer surface of the first reflective layer 161 prevents generation of shock when the light-emitting device is mounted on a package. In addition, the shock buffer layer may be made of a material with a superior thermal conductivity and thus serve as a heat sink.

Figure 2A:
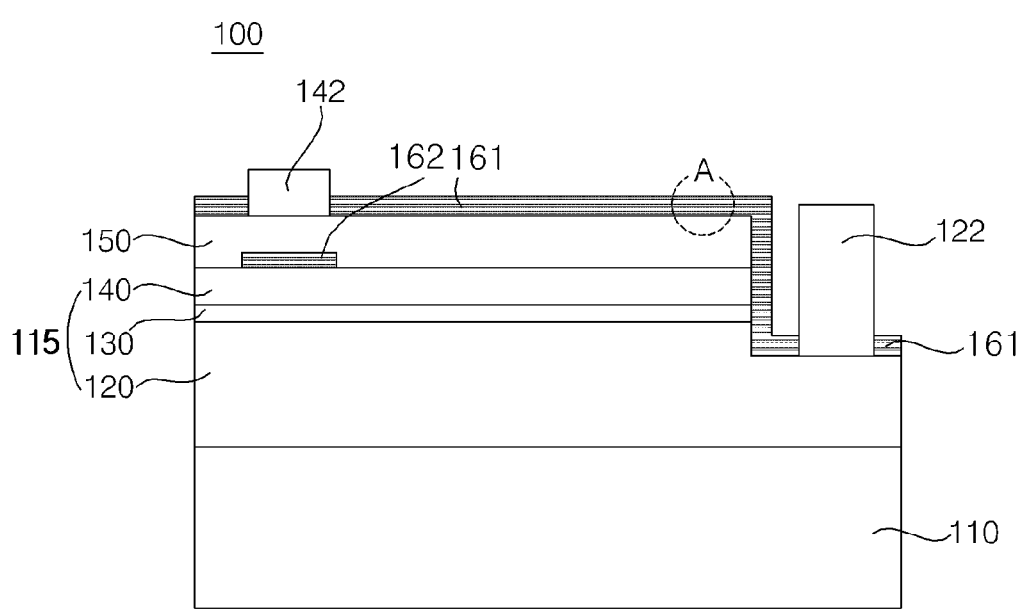
FIG. 2A is a sectional view illustrating the cross-section of a light-emitting device according to an embodiment.
Figure 2B:
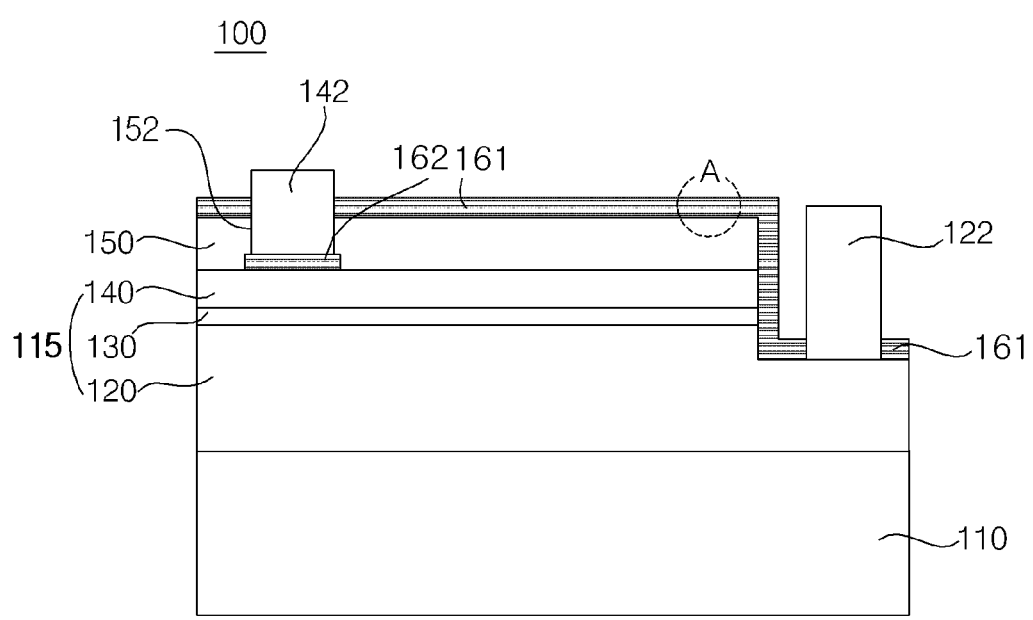
FIG. 2B is a sectional view illustrating the cross-section of a light-emitting device according to an embodiment.
Figure 2C:
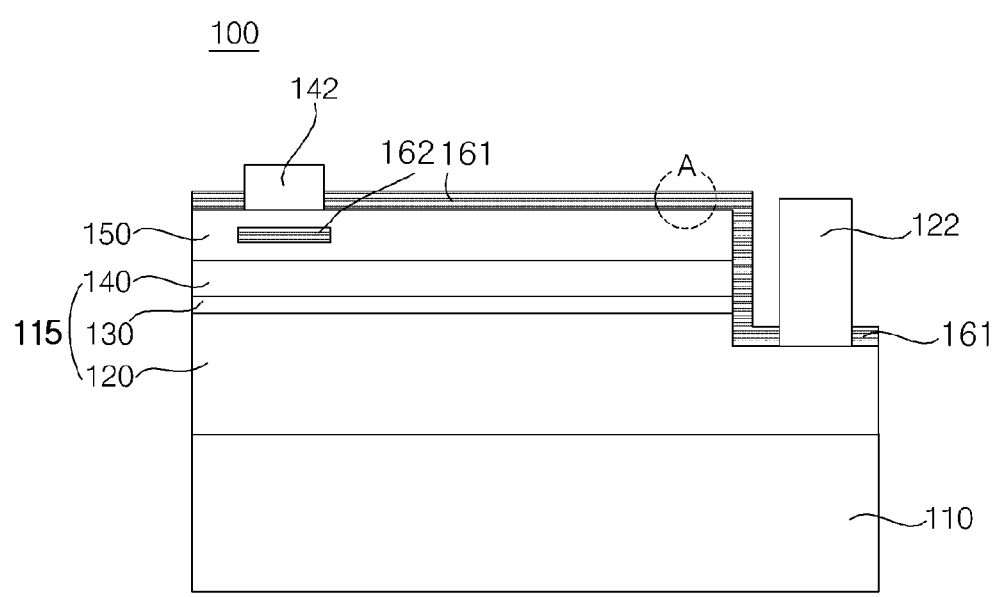
FIG. 2C is a sectional view illustrating the cross-section of a light-emitting device according to an embodiment.

FIGS. 2A to 2C are sectional views illustrating the light-emitting device according to one embodiment.

Referring to FIGS. 2A to 2C, the light-emitting device 100 according to the embodiment may include a second reflective layer 162.

Referring to FIGS. 2A to 2C, the second reflective layer 162 may be on the second semiconductor layer 140, and the second reflective layer 162 may at least partially vertically overlap the second electrode pad 142. This is the same, as shown in FIG. 2B, in the case where the second electrode pad 142 is formed on the light-transmitting electrode layer 150, and in the case where the opening 152 is formed in the light-transmitting electrode layer 150 and the second electrode pad 142 is formed. In addition, as shown in FIG. 2C, the second reflective layer 162 is a mono-layer formed in the light-transmitting electrode layer 150 such that it does not contact the second semiconductor layer 140 and the second electrode pad 142, without being limited thereto.

Preferably, the second reflective layer 162 may have a greater width than the second electrode pad 142.

The second reflective layer 162 vertically overlapping the second electrode pad 142 has higher light reflectivity than the metal constituting the second electrode pad 142, thus minimizing light absorbance by the second electrode pad 142 and light loss thereby and improving light extraction efficiency of the light-emitting device 100.

Meanwhile, in the case where the opening 152 is formed in the light-transmitting electrode layer 150 and the second electrode pad 142 is formed in the opening 152, the second reflective layer 162 may be formed such that it contacts the second electrode pad 142.

The second reflective layer 162 may contact the second electrode pad 142 and the second semiconductor layer 140 to prevent direct transfer of current from the second electrode pad 142 to the second semiconductor layer 140 and thereby enable wide diffusion of current in the light-transmitting electrode layer 150.

Meanwhile, the structure of the first reflective layer 161 or second reflective layer 162 will be described with reference to FIG. 3 in more detail.

Figure 3:
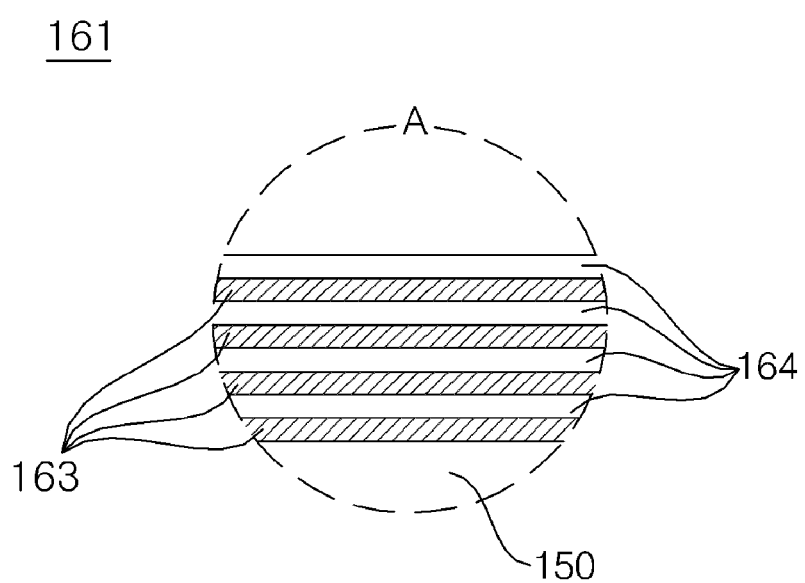
FIG. 3 is a partial enlarged view illustrating the A region of the light-emitting device shown in FIG. 1A.

FIG. 3 is a partial enlarged view illustrating the A region of the light-emitting device shown in FIGS. 1A to 2B.

Referring to FIG. 3, the first reflective layer 161 may be a distributed Bragg reflector (DBR) layer including a plurality of different layers.

The first reflective layer 161 may include a first layer 163 having a first index of refraction and a second layer 164 having a second index of refraction different from the first index of refraction. The first and second layers 163 and 164 are described in the drawing, but are not limited thereto. The first reflective layer 161 may include a plurality of layers (not shown) having different indexes of refraction.

That is, the first reflective layer 161 may have a structure in which the layers 163 and 164 with different indexes of refraction are alternately laminated. In an example, the first layer 163 may have a low index of refraction and the second layer 164 may have a high index of refraction, but the present invention is not limited thereto.

Preferably, the first reflective layer 161 may include 2 to 31 layers.

Meanwhile, assuming that $\lambda$ is a wavelength of light generated from the active layer 130, n is the index of refraction of a medium and m is an odd number, the first DBR layer 161 may have a semiconductor laminate structure which may be obtained by repeatedly alternately laminating a first layer 163 having a thickness of $m\lambda/4n$ and a low index of refraction and a second layer 164 having a high index of refraction to obtain a light reflectivity of 95% or higher in a specific wavelength region ($\lambda$).

Accordingly, the first layer 163 having a low index of refraction and the second layer 164 having a high index of refraction may have a thickness of $\lambda/4$ of reference wavelength, and the layers 163 and 164 may have a thickness of 2 Å to 10 um.

In addition, the layers 163 and 164 constituting the first reflective layer 161 may include $Al_2O_3$, $SiO_2$, $TiO_2$, $TiN_x$, $InO_x$, $SiN_x$, $Ta_xO_y$ (x, y: constant), or include $M_xO_y$ (M: Metal, O: Oxide, x, y: constant), although the present invention is not limited thereto.

In an example, the first layer 163 having a low index of refraction may utilize $SiO_2$ having an index of refraction of 1.4 or $Al_2O_3$ having an index of refraction of 1.6, the second layer 164 having a high index of refraction may utilized $TiO_2$ having an index of refraction of 2 or higher, and the present invention is not limited thereto.

Meanwhile, the index of refraction of medium between the first layer 163 having a low index of refraction and the second layer 164 having a high index of refraction is increased in order to increase reflectivity, although the present invention is not limited thereto.

The first reflective layer 161 has a greater band gap than that of oscillating wavelength and thus does not absorb light and may realize high light reflectivity.

Meanwhile, the second reflective layer 162 shown in FIGS. 1A and 2 may have the same structure as the first reflective layer 161 mentioned above. That is, the second reflective layer 162 includes a third layer (not shown) having a third index of refraction and a fourth layer (not shown) having a fourth index of refraction different from the third index of refraction, the third layer (not shown) and the fourth layer (not shown) are alternately repeatedly laminated, and the third layer (not shown) and the fourth layer (not shown) may have a thickness of 2 Å to 10 um.

That is, the third layer (not shown) and the fourth layer (not shown) may be the same as the first layer 163 or the second layer 164.

Accordingly, as shown in FIGS. 1A and 2, the first reflective layer 161 and the second reflective layer 162 correspond to the outer surface of the light-emitting device 100 and the second electrode pad 142 to improve luminous efficiency of the light-emitting device 100.

Figure 4:
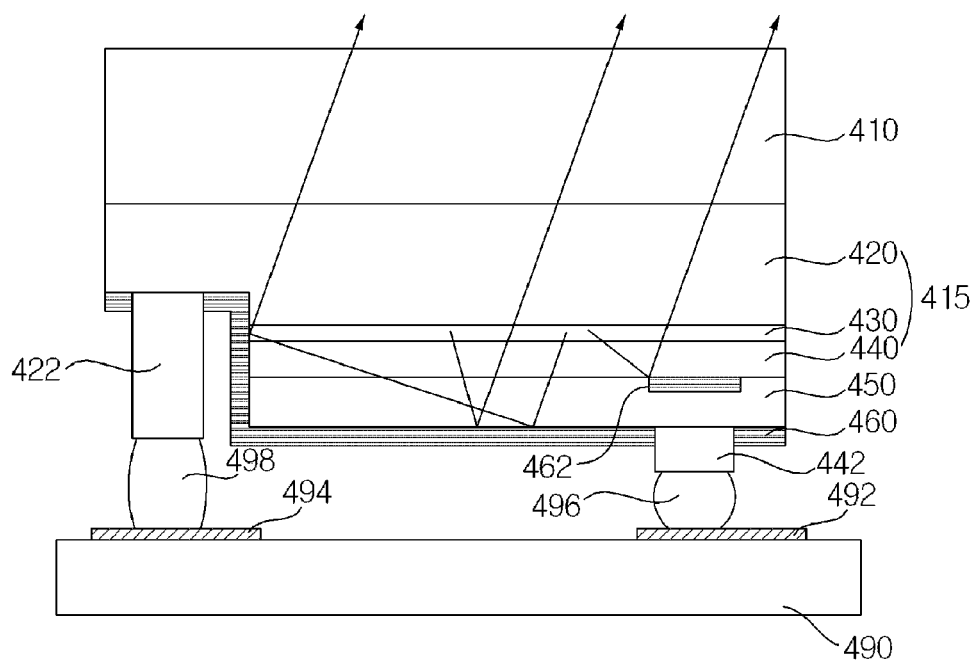
FIG. 4 is a view illustrating a state in which the light-emitting device is flip-chip bonded to a package substrate.

FIG. 4 is a view illustrating a state in which the light-emitting device is flip chip bonded.

Referring to FIG. 4, a light-emitting device 400 may be flip-chip bonded to a package body 490.

During the flip chip bonding, the light-emitting device 400 rotates 180° and is thus mounted on the package body 490. In FIG. 4, the top and bottom of the light-emitting device 400 are reversed.

The light-emitting device 400 includes: a substrate 410 composed of sapphire ($Al_2O_3$); a light-emitting structure 415 on the substrate 410 and including a first semiconductor layer 420, an active layer 430 and a second semiconductor layer 440; a light-transmitting electrode layer 450; and a first reflective layer 460. The active layer 430 and the second semiconductor layer 440 are partially removed to expose a part of the first semiconductor layer 420 and a first electrode pad 422 may be on the exposed first semiconductor layer 420. In addition, a second electrode pad 442 is on the second semiconductor layer 450.

Meanwhile, as shown in FIG. 4, the first reflective layer 460 may be formed in a region, where the second electrode pad 442 is not formed, on the light-transmitting electrode layer 450, in a region, where the first electrode pad 442 is not formed, under the partially exposed first semiconductor layer 420, and on the exposed side from which the active layer 430 and the second semiconductor layer 440 are partially removed.

In addition, a second reflective layer 462 may be arranged between the second electrode pad 442 and the second semiconductor layer 440.

Meanwhile, the first reflective layer 460 and the second reflective layer 462 may be a distributed Bragg reflector (DBR) layer in which a layer having a low index of refraction and a layer having a high index of refraction are alternately repeatedly laminated.

The first and second reflective layers 460 and 462 serve as a protective layer to protect the light-transmitting electrode layer 450 or the first semiconductor layer 420, and prevent light absorbance in the second electrode pad 442 and guide light to the substrate 410, thereby improving efficiency of the light-emitting device 400.

That is, as shown in FIG. 4, light generated from the active layer 430 is reflected by the first and second reflective layers 460 and 462 and overall directed toward the substrate 410. The substrate 410 has a higher index of refraction than the first semiconductor layer 420 and the first semiconductor layer 420 has a higher index of refraction than the active layer 430. For this reason, in accordance with the Snell's law, light is directed from a medium having a low index of refraction to a medium having a higher index of refraction, total reflection does not occur on the boundary between the media. As a result, light extraction efficiency can be improved.

Meanwhile, conductive patterns 492 and 494 are on the package body 490, the conductive patterns 492 and 494 are electrically connected to the second electrode pad 442 and the first electrode pad 422 of the light-emitting device through soldering members 494 and 496.

Meanwhile, in the process of manufacturing a flip chip package, shock may occur. In order to prevent shock, a shock buffer layer (not shown) may be further formed on the outer surface of the first reflective layer 460. The shock buffer layer (not shown) may be composed of tungsten (W) or an alloy thereof. In addition, since tungsten (W) or an alloy thereof exhibits superior thermal conductivity, the shock buffer layer (not shown) may serve as a heat sink.

Figure 5A:
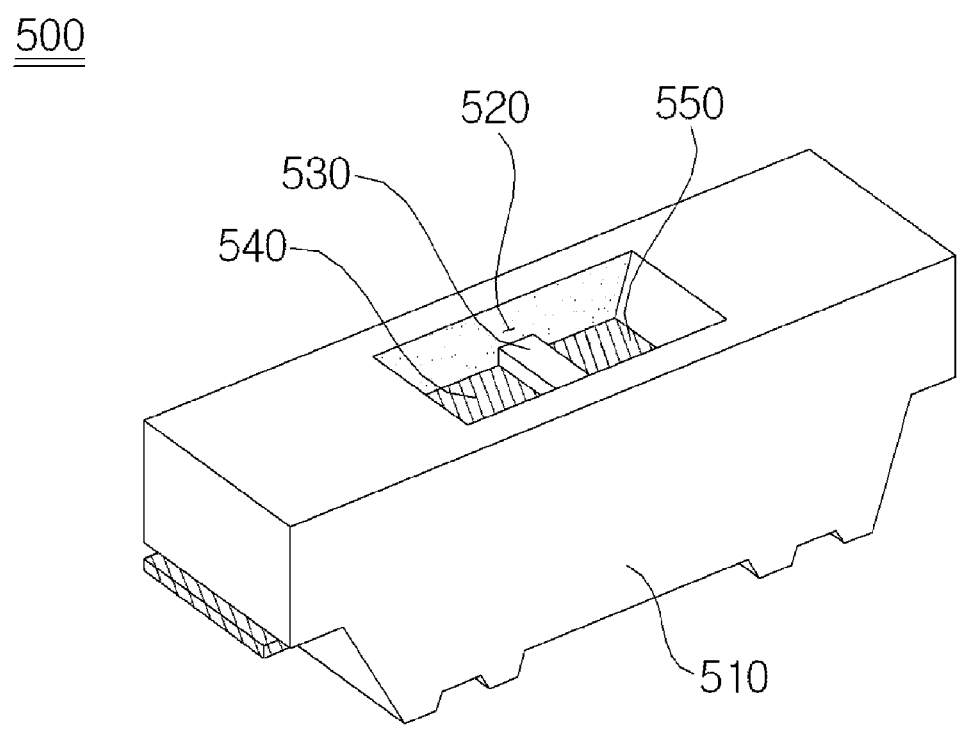
FIG. 5A is a perspective view illustrating a light-emitting device package including the light-emitting device according to an embodiment.
Figure 5B:
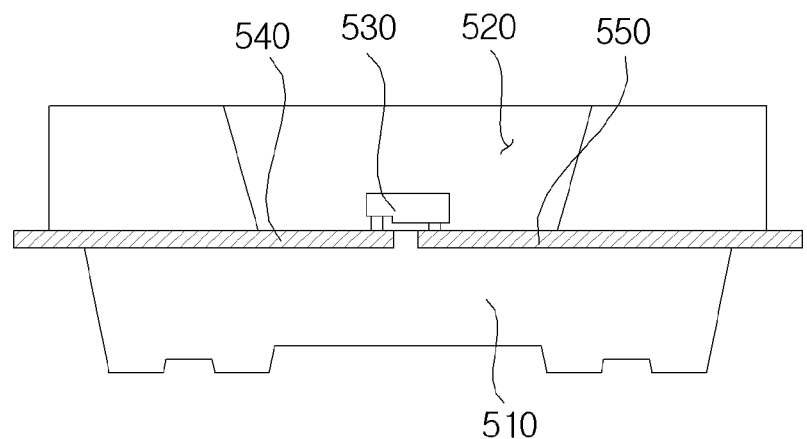
FIG. 5B is a sectional view illustrating a light-emitting device package including the light-emitting device according to an embodiment.
Figure 5C:
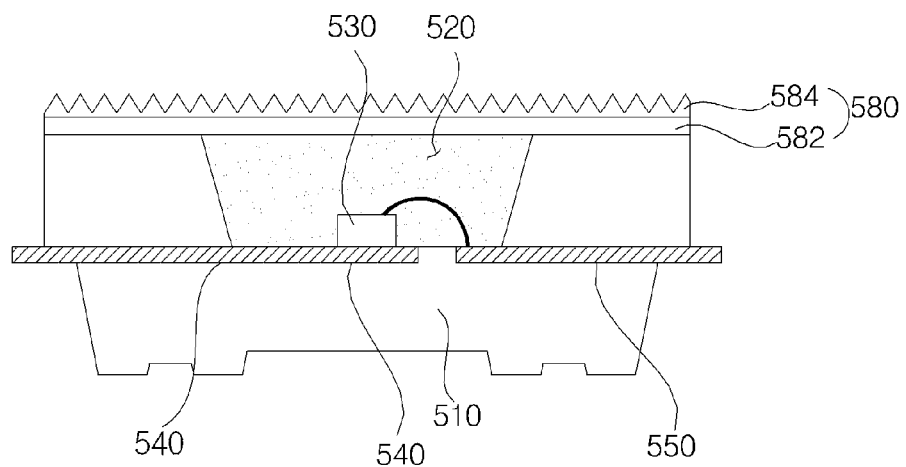
FIG. 5C is a sectional view illustrating a light-emitting device package including the light-emitting device according to an embodiment.

FIGS. 5A to 5C are a perspective view and a sectional view illustrating a light-emitting device package according to one embodiment.

Referring to FIGS. 5A to 5C, a light-emitting device package 500 includes a body 510 including a cavity 520, first and second lead frames 540 and 550 mounted on the body 510, a light-emitting device 530 electrically connected to the first and second lead frame 540 and 550, and a sealant (not shown) filling the cavity 520 to cover the light-emitting device 530.

The body 510 may be composed of at least one selected from resin materials such as polyphthalamide (PPA), silicon (Si), aluminum (Al), aluminum nitride (AlN), photo sensitive glass (PSG), polyamide9T (PA9T), syndiotactic polystyrene (SPS), metal materials, sapphire ($Al_2O_3$), beryllium oxide (BeO) and printed circuit boards (PCB). The body 510 may be formed by a process such as injection molding and etching, without being limited thereto.

The inner surface of the body 510 may include an inclined surface. The reflective angle of light emitted from the light-emitting device 530 may be varied depending on the angle of the inclined surface. Accordingly, the orientation angle of light discharged outside can be controlled.

As the orientation angle of light decreases, convergence of light emitted from the light-emitting device 530 to the outside increases. On the other hand, as the orientation angle of light increases, convergence of light from the light-emitting device 530 to the outside decreases.

Meanwhile, as seen from the top, the cavity 520 provided in the body 510 may have various shapes including a circular shape, a rectangular shape, a polygonal shape, an oval shape and a shape with curved corners, although the present invention is not limited thereto.

The light-emitting device 530 may be electrically connected to the first and second lead frames 540 and 550 in a flip chip manner.

Meanwhile, the light-emitting device 530 according to the embodiment includes a reflective layer (not shown) to improve luminous efficiency.

The cavity 520 is filled with the sealant (not shown) such that the sealant covers the light-emitting device 530.

The sealant (not shown) may be composed of silicon, epoxy or other resin material and may be formed by filling the cavity 520 with a sealant material, followed by UV or heat curing.

In addition, the sealant (not shown) may include a phosphor, and the phosphor is selected from depending on the wavelength of light emitted from the light-emitting device 530 to allow the light-emitting device package to render white light.

Depending on the wavelength of light emitted from the light-emitting device 530, such a phosphor may be at least one of blue light-emitting phosphors, bluish green light-emitting phosphors, green light-emitting phosphors, yellowish green light-emitting phosphors, yellow light-emitting phosphors, yellowish red light-emitting phosphors, orange light-emitting phosphors, and red light-emitting phosphors.

That is, the phosphor is excited by a first light emitted from the light-emitting device 530 to produce second light. For example, in the case where the light-emitting device 530 is a blue light-emitting diode and the phosphor is a yellow phosphor, the yellow phosphor is excited by blue light to emit yellow light, blue light emitted from the blue light-emitting diode is mixed with yellow light which is excited and thus produced by blue light to allow the light-emitting device package 500 to render white light.

Similarly, in the case where the light-emitting device 530 is a green light-emitting diode, the magenta phosphor or a combination of blue and red phosphors may be exemplified, and in the case where the light-emitting device 530 is a red light-emitting diode, a cyan phosphor or a combination of blue and green phosphors may be exemplified.

Such a phosphor may be a known phosphor such as YAG, TAG, sulfides, silicates, aluminates, nitrides, carbides, nitridosilicates, borates, fluorides and phosphates.

The first and second lead frames 540 and 550 may include a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and an alloy thereof. In addition, the first and second lead frames 540 and 550 may have a mono- or multi-layer structure, although the present invention is not limited thereto.

The first second lead frame 540 and 550 are spaced from each other and are electrically separated. The light-emitting device 530 is mounted on the first and second lead frames 540 and 550, and the first and second lead frames 540 and 550 directly contact the light-emitting device 530, or are electrically connected thereto through a conductive material such as soldering member (not shown). In addition, the light-emitting device 530 may be electrically connected to the first and second lead frames 540 and 550 via wire bonding, although the present invention is not limited thereto. Accordingly, when a power source is connected to the first and second lead frames 540 and 550, power may be supplied to the light-emitting device 530. Meanwhile, a plurality of lead frames (not shown) are mounted in the body 510 and respective lead frames (not shown) are electrically connected to the light-emitting device 530, although the present invention is not limited thereto.

Meanwhile, referring to FIG. 5C, the light-emitting device package 500 according to the embodiment may include an optical sheet 580 and the optical sheet 580 may include a base 582 and a prism pattern 584.

The base 582 is a supporter to form the prism pattern 584, which is composed of a transparent material exhibiting superior thermal stability. For example, such a transparent material may be selected from the group consisting of polyethylene terephthalate, polycarbonate, polypropylene, polyethylene, polystyrene and polyepoxy, but is not limited thereto.

In addition, the base 582 may include a phosphor (not shown). For example, the base 582 may be formed by homogenously dispersing a phosphor (not shown) in the material constituting the base 582, followed by curing. When the base 582 is formed according to this method, the phosphor (not shown) can be homogeneously dispersed throughout the base 582.

Meanwhile, a prism pattern 584 to refract and concentrate light may be on the base 582. A material for the prism pattern 584 may be an acrylic resin, without being limited thereto.

The prism pattern 584 includes a plurality of linear prisms arranged in one direction on one surface of the base 582 such that the linear prisms are parallel to one another and the cross-section of the linear prisms taken along an axial direction may take the shape of a triangle.

The prism pattern 584 can concentrate light. For this reason, when the optical sheet 580 is adhered to the light-emitting device package 500 of FIG. 5, straightness of light can be improved and brightness of the light-emitting device package 500 can be thus enhanced.

Meanwhile, the prism pattern 584 may include a phosphor (not shown).

The phosphor (not shown) may be uniformly present in the prism pattern 584 by mixing the phosphor with an acrylic resin which forms the prism pattern 584 in a dispersed state to produce a paste or slurry and then forming the prism pattern 584.

In the case where the phosphor (not shown) is present in the prism pattern 584, light uniformity and distribution level of the light-emitting device package 500 are improved and the orientation angle of light-emitting device package 500 can be thus improved due to dispersion effect of light by the phosphor (not shown) as well as concentration effect of light by the prism pattern 584.

The light-emitting device package 500 according to one embodiment is arrayed in plural on the substrate and optical members such as the light guide plate, prism sheet and diffusion sheet may be on a light passage of the light-emitting device package 500. The light-emitting device package, the substrate and the optical members may serve as a light unit. In another embodiment, a display device, an indicating device and a lighting device including the light-emitting device or light-emitting device packages disclosed in the afore-mentioned embodiments may be realized. For example, the lighting device may include a lamp, a streetlamp, or the like.

Figure 6A:
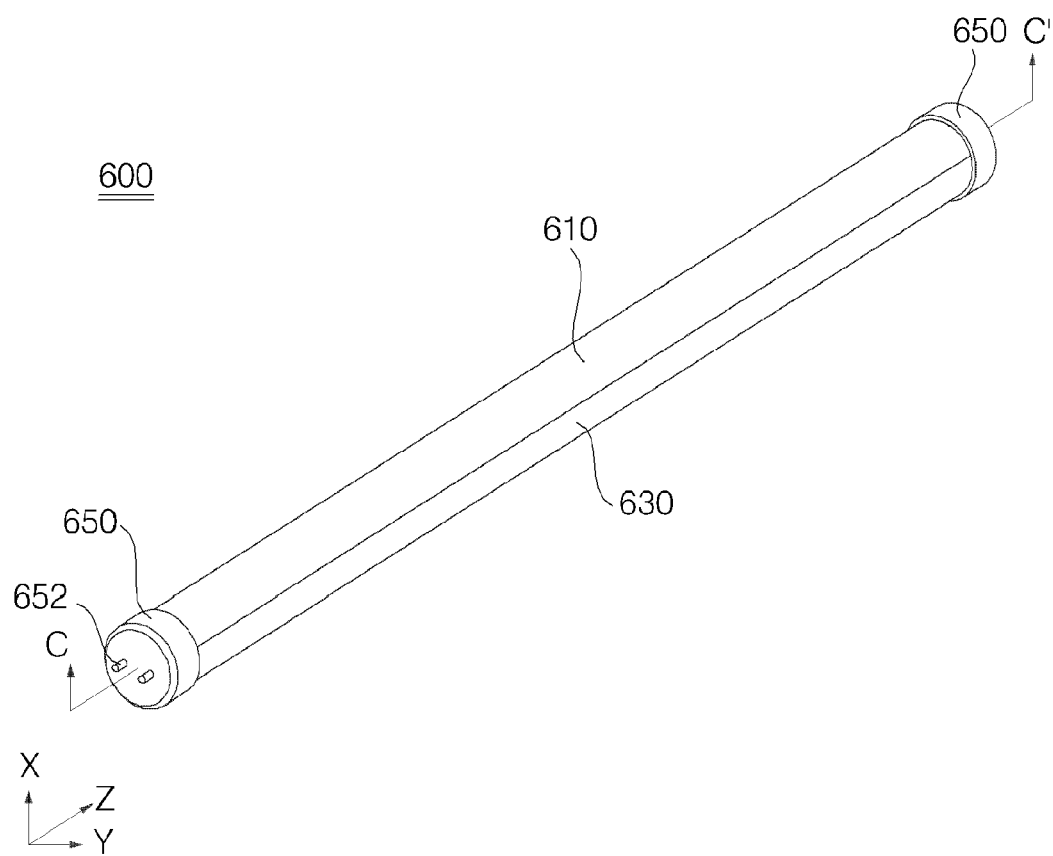
FIG. 6A is a perspective view illustrating a lighting device including the light-emitting device package.
Figure 6B:
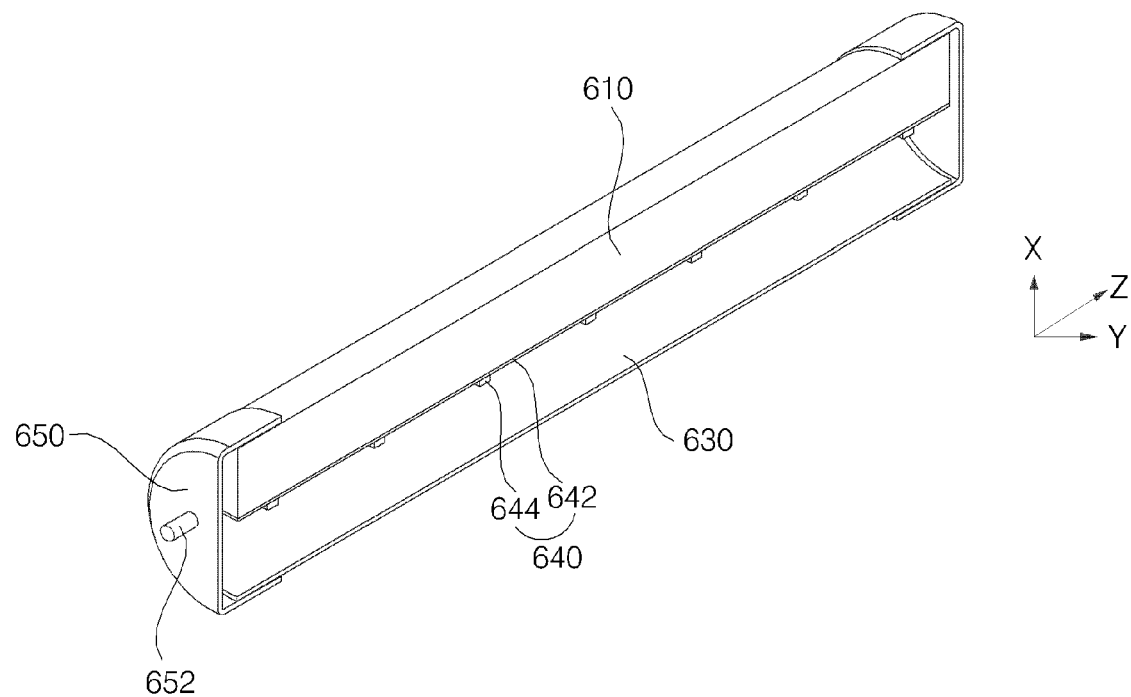
FIG. 6B is a sectional view illustrating a lighting device including the light-emitting device package.

FIG. 6A is a perspective view illustrating a lighting device including the light-emitting device package according to one embodiment. FIG. 6B is a sectional view illustrating the cross-section taken along the line of C—C' of the lighting device of FIG. 6A.

Referring to FIGS. 6A and 6B, the lighting device 600 may include a body 610, a cover 630 connected to the body 610 and an end cap 650 arranged at both ends of the body 610.

A light-emitting device module 640 is connected to the bottom of the body 610 and the body 610 may be composed of a metal material which exhibits superior conductivity and heat release effect in order to discharge heat generated from the light-emitting device package 644 to the outside through the top of the body 610.

The light-emitting device packages 644 are mounted on the PCB 642 in multiple colors and multiple rows to constitute an array, and may be spaced from one another by a predetermined distance or by different distances, as necessary, to control brightness. The PCB 642 may be a metal core PCB (MPPCB) or PCB made of FR4.

In particular, the light-emitting device package 644 includes a light-emitting device (not shown), and the light-emitting device (not shown) includes a reflective layer (not shown) to improve light extraction efficiency and thereby improve luminous efficiency of the light-emitting device package and lighting device.

The light-emitting device package 644 includes an extended lead frame (not shown) to improve light irradiation and thus enhance reliability and efficiency of the light-emitting device package 644, and lengthen the lifespan of the lighting device 600 including the light-emitting device package 622 and the light-emitting device package 644.

The cover 630 may take the shape of a circle to surround the bottom of the body 610, without being limited thereto.

The cover 630 protects the light-emitting device module 640 from foreign substances. In addition, the cover 630 prevents glare generated from the light-emitting device package 644 and includes diffusion particles to uniformly discharge light to the outside. In addition, a prism pattern or the like may be formed on at least one of the inner and outer surfaces of the cover 630. Alternatively, a phosphor may be applied onto at least one of the inner and outer surfaces of the cover 630.

Meanwhile, the cover 630 should exhibit superior light transmittance, in order to discharge light generated from the light-emitting device package 644 through the cover 630 to the outside, and the cover 630 should exhibit sufficient heat resistance in order to endure heat emitted by the light-emitting device package 644. Preferably, the cover 630 is composed of a material including polyethylene terephthalate (PET), polycarbonate (PC) or polymethyl methacrylate (PMMA) and the like.

The end cap 650 is on both ends of the body 610 and may be used to seal a power device (not shown). In addition, the end cap 650 may include a power pin 652, allowing the lighting device 600 to be applied to a conventional terminal in which a fluorescent light is removed, without using any additional device.

Figure 7:
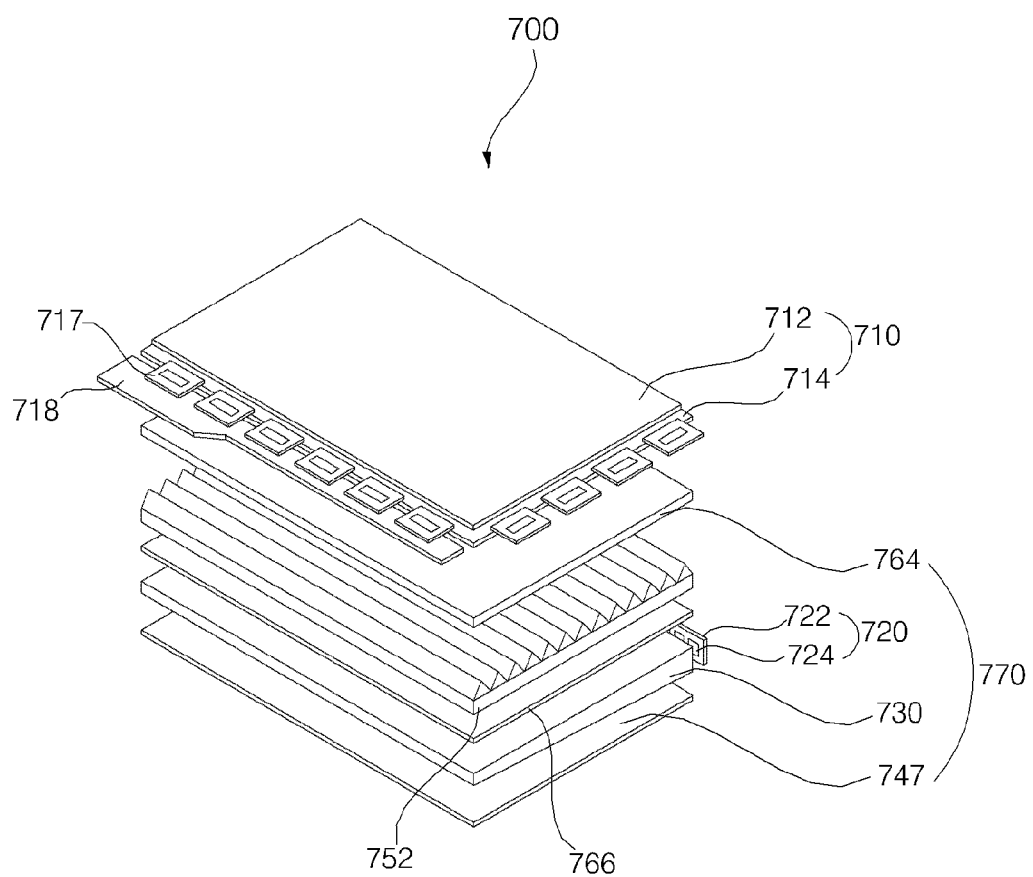
FIG. 7 is an exploded perspective view illustrating a liquid crystal display including the light-emitting device according to an embodiment.

FIG. 7 is an exploded perspective view illustrating a liquid crystal display including the light-emitting device according to one embodiment.

FIG. 7 illustrates an edge-light type liquid crystal display device 700 which includes a liquid crystal display panel 710 and a backlight unit 770 to supply light to the liquid crystal display panel 710.

The liquid crystal display panel 710 displays an image using light supplied from the backlight unit 770. The liquid crystal display panel 710 includes a color filter substrate 712 and a thin film transistor substrate 714 which face each other such that a liquid crystal is interposed therebetween.

The color filter substrate 712 can realize color of images to be displayed through the liquid crystal display panel 710.

The thin film transistor substrate 714 is electrically connected to a printed circuit board 718 on which a plurality of circuit components are mounted through a driving film 717. The thin film transistor substrate 714 responds to drive signals supplied from the printed circuit board 718 and may apply a drive voltage from the printed circuit board 718 to liquid crystals.

The thin film transistor substrate 714 includes a thin film transistor and a pixel electrode formed as a thin film on another substrate composed of a transparent material such as glass or plastic.

The backlight unit 770 includes a light-emitting device module 720, a light guide plate 730 to convert light emitted from the light-emitting device module 720 into a surface light source and supply the light to the liquid crystal display panel 710, a plurality of films 750, 766 and 764 to uniformize brightness of light from the light guide plate 730 and improve vertical incidence, and a reflective sheet 740 to reflect light emitted to the back of the light guide plate 730 to the light guide plate 730.

The light-emitting device module 720 includes a plurality of light-emitting device packages 724 and a PCB 722 on which the light-emitting device packages 724 are mounted to form an array.

In particular, the light-emitting device package 724 includes a light-emitting device (not shown) and the light-emitting device (not shown) includes a reflective layer (not shown) to improve light extraction efficiency and thereby luminous efficiency of the light-emitting device package 724 and the backlight unit 770.

Meanwhile, the backlight unit 770 includes a diffusion film 766 to diffuse light incident from the light guide plate 730 toward the liquid crystal display panel 710, a prism film 750 to concentrate the diffused light and thus improve vertical incidence and a protective film 764 to protect the prism film 750.

Figure 8:
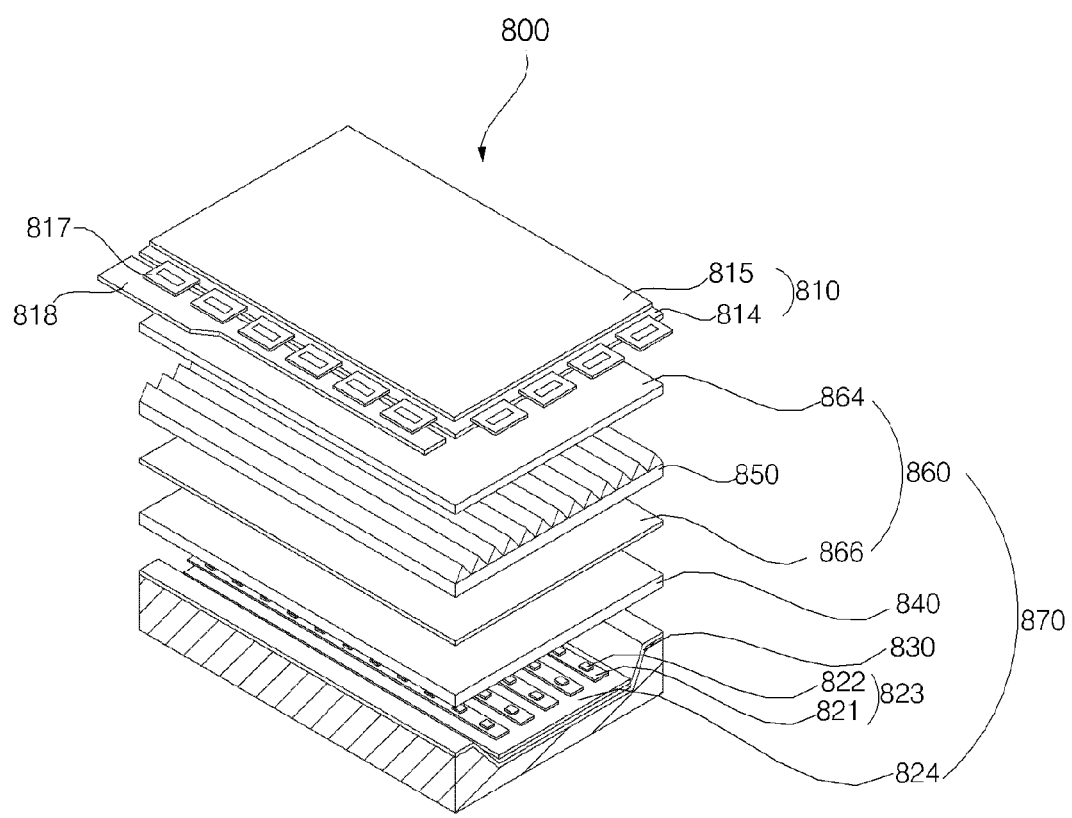
FIG. 8 is an exploded perspective view illustrating a liquid crystal display including the light-emitting device according to an embodiment.

FIG. 8 is an exploded perspective view illustrating a liquid crystal display including the light-emitting device according to one embodiment. The contents illustrated and described in FIG. 7 are not mentioned in detail.

FIG. 8 illustrates a direct-type liquid crystal display device 800 which includes a liquid crystal display panel 810 and a backlight unit 870 to supply light to the liquid crystal display panel 810.

The liquid crystal display panel 810 is described in FIG. 7 and a detailed explanation thereof is omitted.

The backlight unit 870 includes a plurality of light-emitting device modules 823, a reflective sheet 824, a lower chassis 830 in which the light-emitting device module 823 and the reflective sheet 824 are accepted, a diffusion plate 840 on the light-emitting device module 823, and a plurality of optical films 860.

The light-emitting device module 823 includes a plurality of light-emitting device packages and a PCB 821 on which the light-emitting device packages 824 are mounted to form an array.

In particular, the light-emitting device package 822 includes a light-emitting device (not shown) and the light-emitting device (not shown) includes a reflective layer (not shown) to improve light extraction efficiency and thereby luminous efficiency of the light-emitting device packages 824 and the backlight unit 870.

The reflective sheet 824 reflects light generated from light-emitting device package 822 toward the liquid crystal display panel 810 to improve luminous efficacy.

Meanwhile, light emitted from the light-emitting device module 823 is incident on the diffusion plate 840 and an optical film 860 is on the diffusion plate 840. The optical film 860 includes a diffusion film 866, a prism film 850 and a protective film 864.

The features, structures and effects illustrated in the above embodiments may be included in at least one embodiment of the present invention but are not limited to one embodiment. Further, those skilled in the art will appreciate that various combinations and modifications of the features, structures and effects illustrated in the respective embodiments are possible. Therefore, it will be understood that these combinations and modifications are covered by the scope of the invention.

Although the embodiments of the present invention have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light-emitting device comprising:
    a substrate;
    a light-emitting structure on the substrate, the light-emitting structure including a first semiconductor layer, an active layer and a second semiconductor layer;
    a light-transmitting electrode layer on the second semiconductor layer;
    a second electrode pad on the light-transmitting electrode layer;
    a first reflective layer on the light-transmitting electrode layer; and
    a second reflective layer arranged in the light-transmitting electrode layer,
    wherein the first reflective layer comprises a first layer having a first index of refraction and a second layer having a second index of refraction different from the first index of refraction, and
    wherein the second reflective layer at least partially vertically overlaps the second electrode pad and includes a third layer having a third index of refraction and a fourth layer having a fourth index of refraction different from the third index of refraction.

2. The device according to claim 1, wherein the first layer has a lower index of refraction than the second layer.

3. The device according to claim 1, wherein the first layer has an index of refraction of 1.4 to 1.6.

4. The device according to claim 1, wherein at least one of the first layer and the second layer comprises at least one of $SiO_2$, $Al_2O_3$ and $TiO_2$.

5. The device according to claim 1, wherein the first layer and the second layer are repeatedly alternately laminated.

6. The device according to claim 1, wherein the first layer and the second layer have a thickness of 2 Å to 10 um.

7. The device according to claim 1, further comprising:
    a first electrode pad on the partially exposed top of the first semiconductor layer,
    wherein the first reflective layer is on the top of the light-transmitting electrode layer and the exposed top of the first semiconductor layer.

8. The device according to claim 7, wherein the first reflective layer extends from the top of the light-transmitting electrode layer to the top of the first semiconductor layer along the side of the active layer and the second semiconductor layer.

9. The device according to claim 7, further comprising:
    an opening provided in a region of the light-transmitting electrode layer,
    wherein the second electrode pad is on the opening and the second reflective layer contacts the second electrode pad and the second semiconductor layer.

10. The device according to claim 7, wherein the third layer has a lower index of refraction than that of the fourth layer.

11. The device according to claim 7, wherein the third layer has an index of refraction of 1.4 to 1.6.

12. The device according to claim 7, wherein at least one of the third layer and the fourth layer includes at least one of $SiO_2$, $Al_2O_3$ and $TiO_2$.

13. The device according to claim 7, wherein the third layer and the fourth layer are repeatedly alternately laminated.

14. The device according to claim 7, wherein the third layer and the fourth layer have a thickness of 2 Å to 10 um.

15. The device according to claim 7, wherein the width of the second reflective layer is greater than that of the second electrode pad.

16. The device according to claim 1, further comprising:
    a buffer layer on the substrate.

17. The device according to claim 1, further comprising:
    a shock buffer layer on the outer surface of the first reflective layer.

18. An emitting device package comprising:
    a body;
    a first lead frame and a second lead frame on the package body; and
    a light-emitting device mounted on the body and electrically connected to the first and second lead frames,
    wherein the light-emitting device comprises:
        a substrate;
        a light-emitting structure on the substrate, the light-emitting structure including a first semiconductor layer, an active layer and a second semiconductor layer;
        a light-transmitting electrode layer on the second semiconductor layer;
        a second electrode pad on the light-transmitting electrode layer;
        a first reflective layer on the light-transmitting electrode layer: and
        a second reflective layer arranged in the light-transmitting electrode layer,
        wherein the first reflective layer comprises a first layer having a first index of refraction and a second layer having a second index of refraction different from the first index of refraction, and
        wherein the second reflective layer at least partially vertically overlaps the second electrode pad and includes a third layer having a third index of refraction and a fourth layer having a fourth index of refraction different from the third index of refraction.

19. A lighting system, comprising:
    a body; and
    a light-emitting module on the body, and on which a light-emitting device is mounted,
    wherein the light-emitting device comprises:
        a substrate;
        a light-emitting structure on the substrate, the light-emitting structure including a first semiconductor layer, an active layer and a second semiconductor layer;
        a light-transmitting electrode layer on the second semiconductor layer;
        a second electrode pad on the light-transmitting electrode layer;
        a first reflective layer on the light-transmitting electrode layer: and
        a second reflective layer arranged in the light-transmitting electrode layer,
        wherein the first reflective layer comprises a first layer having a first index of refraction and a second layer having a second index of refraction different from the first index of refraction, and wherein the second reflective layer at least partially vertically overlaps the second electrode pad and includes a third layer having a third index of refraction and a fourth layer having a fourth index of refraction different from the third index of refraction.